US006038182A

United States Patent [19]

Hwang

[11] Patent Number: 6,038,182

[45] Date of Patent: Mar. 14, 2000

[54] INTEGRATED CIRCUIT MEMORY DEVICES AND TESTING METHODS INCLUDING SELECTABLE INPUT/OUTPUT CHANNELS

[75] Inventor: Moon-chan Hwang, Seoul, Rep. of Korea

[73] Assignee: Samsung Electronics Co., Ltd., Rep. of Korea

[21] Appl. No.: 09/199,026

[22] Filed: Nov. 24, 1998

[30] Foreign Application Priority Data

Feb. 2, 1998 [KR] Rep. of Korea ........................ 98-2780

[51] Int. Cl.[7] ........................................................ G11C 7/00

[52] U.S. Cl. ................ 365/201; 365/189.02; 365/189.07

[58] Field of Search .............................. 365/201, 189.02, 365/189.07, 189.05; 371/21.1, 21.2, 21.3

[56] References Cited

U.S. PATENT DOCUMENTS

| | | | |
|---|---|---|---|
| 5,717,643 | 2/1998 | Iwanami et al. | 365/201 |
| 5,748,641 | 5/1998 | Ohsawa | 365/201 |
| 5,793,686 | 8/1998 | Furutani et al. | 365/201 |
| 5,793,687 | 8/1998 | Deans et al. | 365/201 |

*Primary Examiner*—Son T. Dinh
*Attorney, Agent, or Firm*—Myers Bigel Sibley & Sajovec

[57] ABSTRACT

Integrated circuit memory devices and testing methods include a plurality of control signals, a respective one of which corresponds to a respective one of a plurality of input/output channels, and activates a selected one of the plurality of input/output channels in response to activation of a selected one of the plurality of control signal inputs during a test mode. All of the plurality of input/output channels may be activated in response to activation of all of the plurality of control signals inputs during a normal mode. Accordingly, a selected one of the data input/output channels may be activated for reduced data path width testing. By sequentially activating a selected one of the data input/output channels, all the circuits of the memory device related to the data input/output channels may be tested.

20 Claims, 6 Drawing Sheets

INTEGRATED CIRCUIT MEMORY DEVICES AND TESTING METHODS INCLUDING SELECTABLE INPUT/OUTPUT CHANNELS

FIELD OF THE INVENTION

This invention relates to integrated circuit memory devices, and more particularly to systems and methods for testing integrated circuit memory devices.

BACKGROUND OF THE INVENTION

As the integration density of integrated circuit memory devices continues to increase, more memory cells may be provided in a single integrated circuit memory device. The increased numbers of integrated circuit memory cells may be arranged in larger data patch widths by providing more input/output channels. Unfortunately, the increased number of input/output channels may make it difficult to test multiple integrated circuit memory devices simultaneously, due to the limitation on the number of input/output channels in integrated circuit memory test equipment. Accordingly, it is known to provide a reduced data path width by reducing the number of input/output channels during testing of integrated circuit memory devices, so that the number of integrated circuit memory devices that can be tested simultaneously may be increased.

FIG. 1 shows a conventional memory device tested by using a representative data input/output channel.

Referring to FIG. 1, the memory device includes an array of memory cells; four input/output channels I/Oi, I/Oj, I/Ok and I/Ol; four data output buffers DOUT BUF i, DOUT BUF j, DOUT BUF k and DOUT BUF l; four data input buffers DIN BUF i, DIN BUF j, DIN BUF k and DIN BUF l; a comparator COMP; a data input driver DINDRV; a read multiplexer RMUX activated by a control signal MDQE; and a write multiplexer WMUX activated by the control signal MDQE. It will be understood that groups of input/output channels, groups of data output buffers, groups of data input buffers, groups of data input drivers, groups of comparators, groups of data input drivers, groups of read multiplexers and groups of write multiplexers also may be provided, as shown in FIG. 1. In a normal mode, the memory device inputs or outputs data via all of the four data input/output channel groups I/Oi, I/Oj, I/Ok and I/Ol.

Operation of the memory device in a test mode will now be described. First, while the control signal MDQE is active, the data is input via a representative data input/output channel group e.g., ith data input/output channel group I/Oi, and then buffered by the ith data input buffer group DIN BUF I to be input to the write multiplexer group WMUX via the ith data line DIi. The data output from the write multiplexer group WMUX is input to the data input driver group DINDRV, and the data output from the data input driver group DINDRV is simultaneously loaded onto the data input/output lines DIOi, DIOj, DIOk and DIOl to be stored in memory cells.

Also, the data stored in the memory cells are input to the comparator group COMP via the data input/output lines DIOi, DIOj, DIOk and DIOl, and comparison data FCOM output from the comparator group COMP is output to external of the memory device, via the read multiplexers RMUX, the ith data output buffer group DOUT BUF I, and the ith data input/output channel group I/Oi in sequence. Thus, in a conventional memory device, data is input or output via only one data input/output channel group in a test mode.

FIG. 2 is a circuit diagram of one of the read multiplexers RMUX shown in FIG. 1. Referring to FIG. 2, the read multiplexer RMUX includes a first buffering portion 11 for buffering data loaded on the data input/output lines DIOi, DIOj, DIOk and DIOl, a first selection portion 12 for selecting the comparison data FCOM output from the comparator group COMP (see FIG. 1) or the data buffered by the first buffering portion 11, and a first latch portion 13 for latching the data selected by the first selection portion 12.

The first buffering portion 11 includes inverters 111 and 112,121 and 122, 131 and 132, and 141 and 142 which are serially connected to the data input/output lines DIOi, DIOj, DIOk and DIOl, respectively. The first latch portion 13 includes inverters 114 through 116, 124 through 126, 134 through 136, and 144 through 146 which respectively latch the data loaded on the data input/output lines DIOi, DIOj, DIOk and DIOl.

The first selection portion 12 includes a first controller 101, a first switch 102 and a second switch 103. The first controller 101 switches on the first switch 102 or the second switch 103, and includes a first NAND gate 104, an inverter 105 and a second NAND gate 106. The first NAND gate 104 receives a read multiplexer enable signal RMUXE which is activated to a logic high when the read multiplexer RMUX is enabled, and the control signal MDQE. The inverter 105 inverts the control signal MDQE, and the second NAND gate 106 receives the signal output from the inverter 105 and the read multiplexer enable signal RMUXE.

The first switch 102 transmits the comparison data FCOM to the first latch portion 13 when activated by the signal output from the first NAND gate 104. The first switch 102 includes an inverter 109 for inverting the signal output from the first NAND gate 104, and a transmission gate 108. The transmission gate 108 has one end for receiving the signal output from the first NAND gate 104 and the other end for receiving the signal output from the inverter 109.

The second switch 103 transmits the data output from the first buffering portion 11 to the first latch portion 13 when activated by the signal output from the second NAND gate 106. The second switch 103 includes an inverter 110 for inverting the signal output from the second NAND gate 106, and a plurality of transmission gates 113, 123, 133 and 143 which respectively have one end to which the signal output from the second NAND gate 106 is input and the other end to which the signal output from the inverter 108 is input.

In a normal mode, the control signal MDQE is a logic low, and the read multiplexer enable signal RMUXE is a logic high, so that the first switch 102 is switched off, and the second switch 103 is switched on. Thus, the data loaded on the data input/output lines DIOi, DIOj, DIOk and DIOl are loaded onto data buses DBi, DBj, DBk and DBj via the first buffering portion 11 and the first latch portion 13 in sequence, and then buffered in the data output buffers DOUT BUF I, DOUT BUF j, DOUT BUF k and DOUT BUF l (see FIG. 1), and then output external of the memory device via the data input/output channel groups I/Oi, I/Oj, I/Ok and I/Ol (see FIG. 1).

In a test mode, the control signal MDQE is a logic high and the read multiplexer enable signal RMUXE is a logic low, so that the first switch 102 is switched on and the second switch 103 is switched off. As a result, the comparison data FCOM is loaded only onto the ith data bus DBi. The comparison data FCOM loaded onto the ith data bus DBi is input to the ith data output buffer DOUT BUF I (see FIG. 1) and output external of the memory device via only the ith data input/output channel group I/Oi (see FIG. 1).

FIG. 3 is a circuit diagram of one of write multiplexers WMUX of FIG. 1.

Referring to FIG. 3, the write multiplexer WMUX includes a second buffering portion 21 for buffering data loaded on the data lines DIi, DIj, DIk and DIl, a second selection portion 22 for selecting the data loaded on all the data lines DIi, DIj, DIk and DIl, or the data loaded onto one of data lines, e.g., ith data line DIi, among the data output from the second buffering portion 21, and a second latch portion 23 for latching the data selected by the second selection portion 22. The second buffering portion 21 includes inverters 151 and 152,161 and 162,171 and 172, and 181 and 182, and the second latch portion 23 includes inverters 155 through 157,165 through 167, 175 through 177, and 185 through 187. The second selection portion 22 includes a second controller 191, a third switch 192 and a fourth switch 193.

The second controller 191 activates the third switch 192 or the fourth switch 193, and includes an inverter 194, a NOR gate 195 and a third NAND gate 196. The inverter 194 inverts the write multiplexer enable signal WMUXE which is activated to a logic high when the write multiplexer WMUX becomes enabled. The NOR gate 195 receives the signal output from the inverter 194 and the control signal MDQE, and the third NAND gate 196 receives the write multiplexer enable signal WMUXE and the control signal MDQE.

The third switch 192 transmits the data loaded onto the data lines DIi, DIk, DIk and DIl to the second latch portion 23 when activated by the signal output from the NOR gate 195. The third switch 192 includes an inverter 198 for inverting the signal output from the NOR gate 195, and a plurality of transmission gates 153,163, 173 and 183 which respectively have one end for receiving the signal output from the NOR gate 195 and the other end for receiving the signal output from the inverter 198.

The fourth switch 193 transmits only the data loaded onto the ith data line DIi when being switched on by the signal output from the third NAND gate 196. The fourth switch 193 includes an inverter 197 for inverting the signal output from the third NAND gate 196, and a plurality of transmission gates 154,164,174 and 184 which respectively have one end for receiving the signal output from the third NAND gate 196 and the other end for receiving the signal output from the inverter 197.

The operation of the write multiplexer WMUX will now be described. First, in a normal mode where the control signal MDQE becomes disabled to a logic low, the third switch 192 is switched on and the fourth switch 193 is switched off, so that the data loaded onto the data lines DIi, DIj, DIk and DIl are loaded onto the data input/output lines DIOi, DIOj, DIOk and DIOl via the second buffering portion 21, the second latch portion 23 and a data input driver group (DINDRV) 24 in sequence, to be stored in the memory cells.

In a test mode where the control signal MDQE is active to logic high, the third switch 192 is switched off and the fourth switch 193 is switched on, so that only the data loaded onto the ith data line DIi is buffered by the second buffering portion 21 and then loaded onto the four data input/output lines DIOi, DIOj, DIOk and DIOl via the second latch portion 23. In other words, the data of the ith data line DIi is loaded onto all the data input/output lines DIOi, DIOj, DIOk and DIOl at the same time to be transmitted to the memory cells. Here, the data loaded onto the ith data line DIi is the data input via the ith data input/output channel group I/Oi.

As described above, in conventional memory devices, a representative data input/output channel group is fixed in a test mode. Thus, when the memory device is tested using test equipment having a limited number of data input/output channels, the reason for failure such as open, short and leakage current in the circuits related to the representative data input/output channel, such as data output buffer, data input buffer, read multiplexer and write multiplexer, may be found. However, the reason for the failure may not be found if the failure occurs in the circuits related to the remaining data input/output channels other than the representative data input/output channel.

SUMMARY OF THE INVENTION

It is therefore an object of the present invention to provide improved integrated circuit memory devices and testing methods therefor.

It is another object of the present invention to provide integrated circuit memory devices and testing methods that can use a reduced number of input/output channels.

It is still another object of the present invention to provide integrated circuit memory devices and testing methods that can use a reduced number of input/output channels during testing, but can nonetheless identify failures in all the input/output channels.

These and other objects are provided according to the present invention by integrated circuit memory devices and testing methods that include a plurality of control signals, a respective one of which corresponds to a respective one of a plurality of input/output channels, and that activate a selected one of the plurality of input/output channels in response to activation of a selected one of the plurality of control signal inputs during a test mode. All of the plurality of input/output channels may be activated in response to activation of all of the plurality of control signal inputs during a normal mode. Accordingly, a selected one of the data input/output channels may be activated for reduced data path width testing. By sequentially activating a selected one of the data input/output channels, all the circuits of the memory device related to the data input/output channels may be tested.

More specifically, integrated circuit memory devices according to the invention include a plurality of input/output channels, an array of memory cells and a plurality of data input buffers, a respective one of which is responsive to a respective one of the plurality of input/output channels to buffer input data from the plurality of input/output channels. A write multiplexer is connected between the plurality of input data buffers and the array of memory cells, to transmit the buffered input data for writing in the array of memory cells in response to a plurality of control signals in a normal mode. The write multiplexer is responsive to a selected one of the plurality of control signals in the test mode, to transmit the buffered input data from one of the plurality of input data buffers that corresponds to the selected one of the plurality of control signals to the memory cell array.

A plurality of data output buffers is also included, a respective of one of which buffers memory cell data that is read from the array of memory cells to the plurality of input/output channels. A read multiplexer is responsive to the array of memory cells, to transmit the memory cell data that is read from the array of memory cells to the plurality of data output buffers in response to the plurality of control signals in the normal mode. The read multiplexer is responsive to the selected one of the plurality of control signals in the test mode, to transmit the memory cell data to one of the plurality of output data buffers that corresponds to the selected one of the plurality of control signals. A comparator receives the memory cell data that is read from the array of memory cells in the test mode and provides comparison data to the read multiplexer.

According to the present invention, one of the data input/output channels can be selected to test circuits of the memory device that are related to the selected data inpuvoutput channel. By sequentially activating a selected one of the data input/output channels, all circuits of the memory device that are related to the data inpuvoutput channels, can be tested.

DESCRIPTION OF THE PREFERRED EMBODIMENT

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Figure 1:
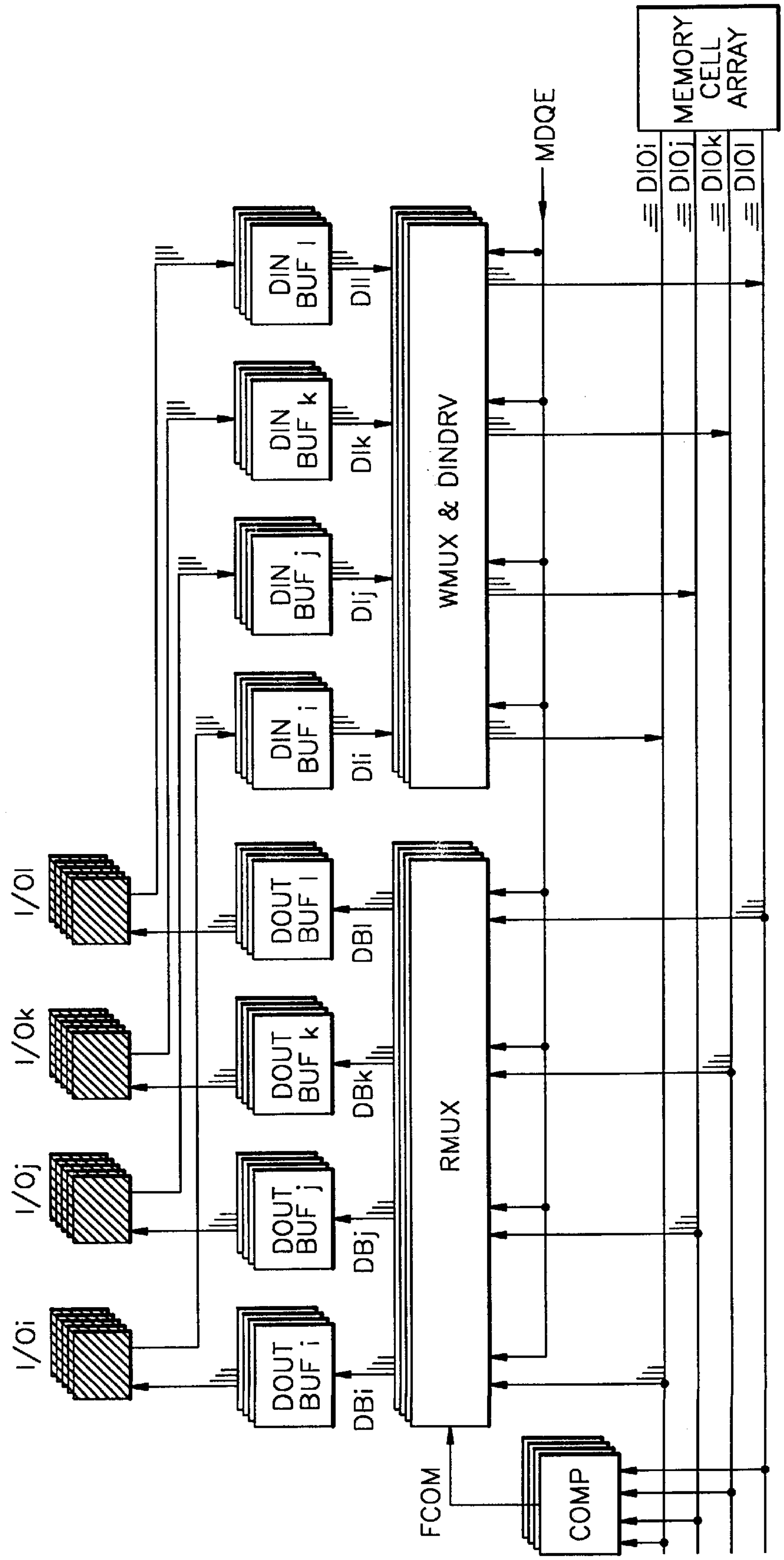
FIG. 1 is a block diagram of a conventional memory device which is tested using a representative data input/output channel group.
Figure 2:
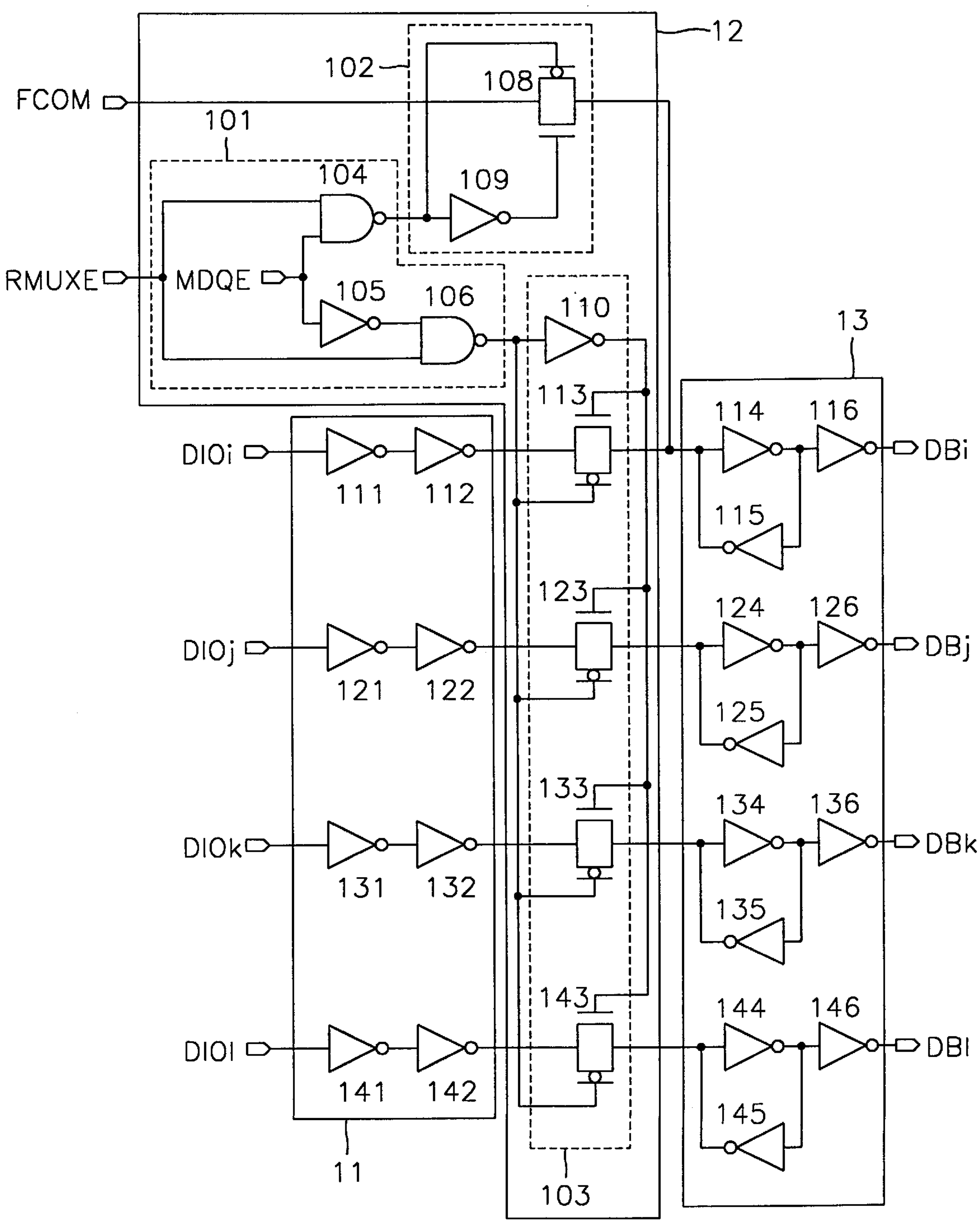
FIG. 2 is a circuit diagram of one of the read multiplexers RMUX shown in FIG. 1.
Figure 3:
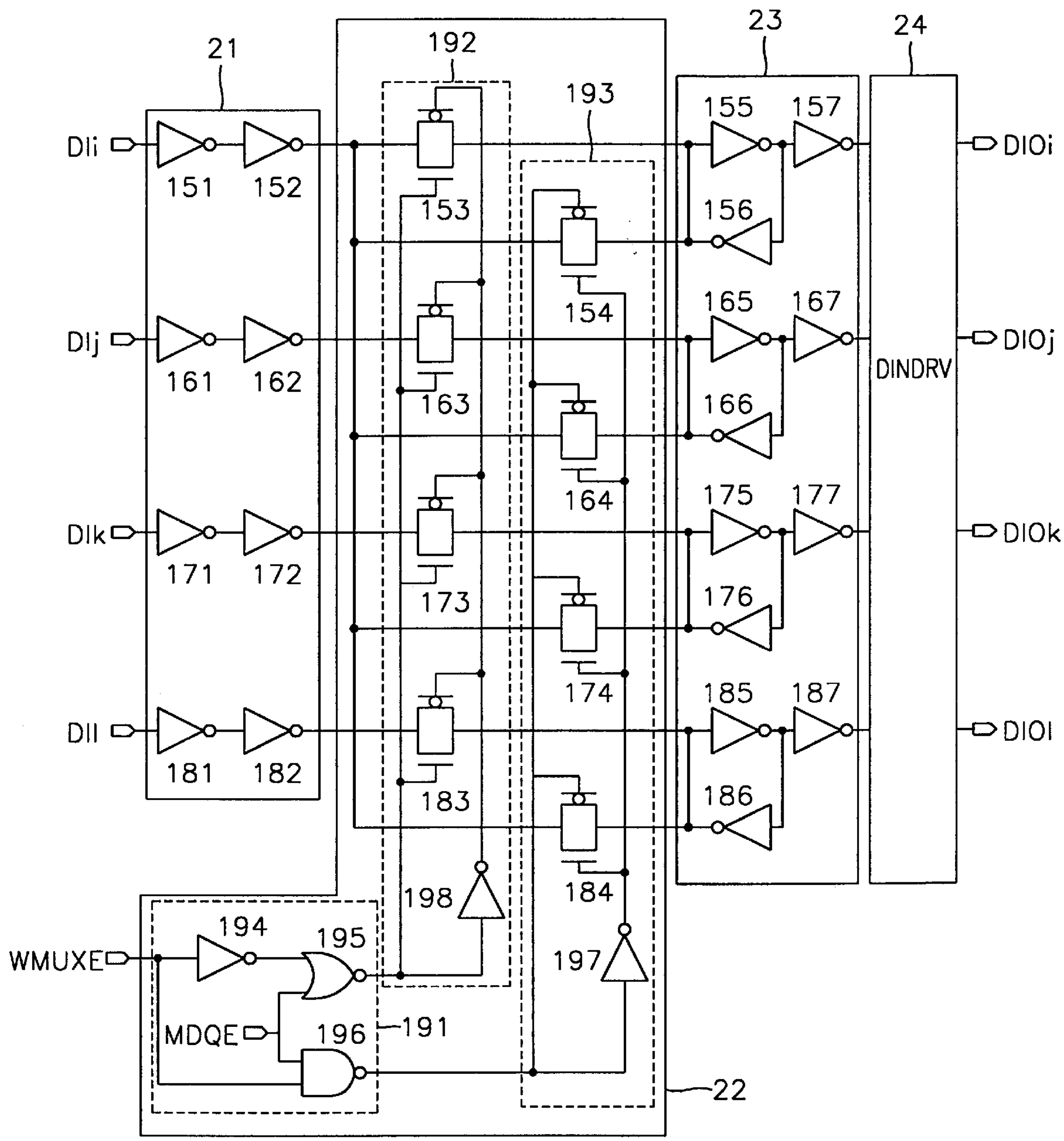
FIG. 3 is a circuit diagram of one of the write multiplexers WMUX shown in FIG. 1.
Figure 4:
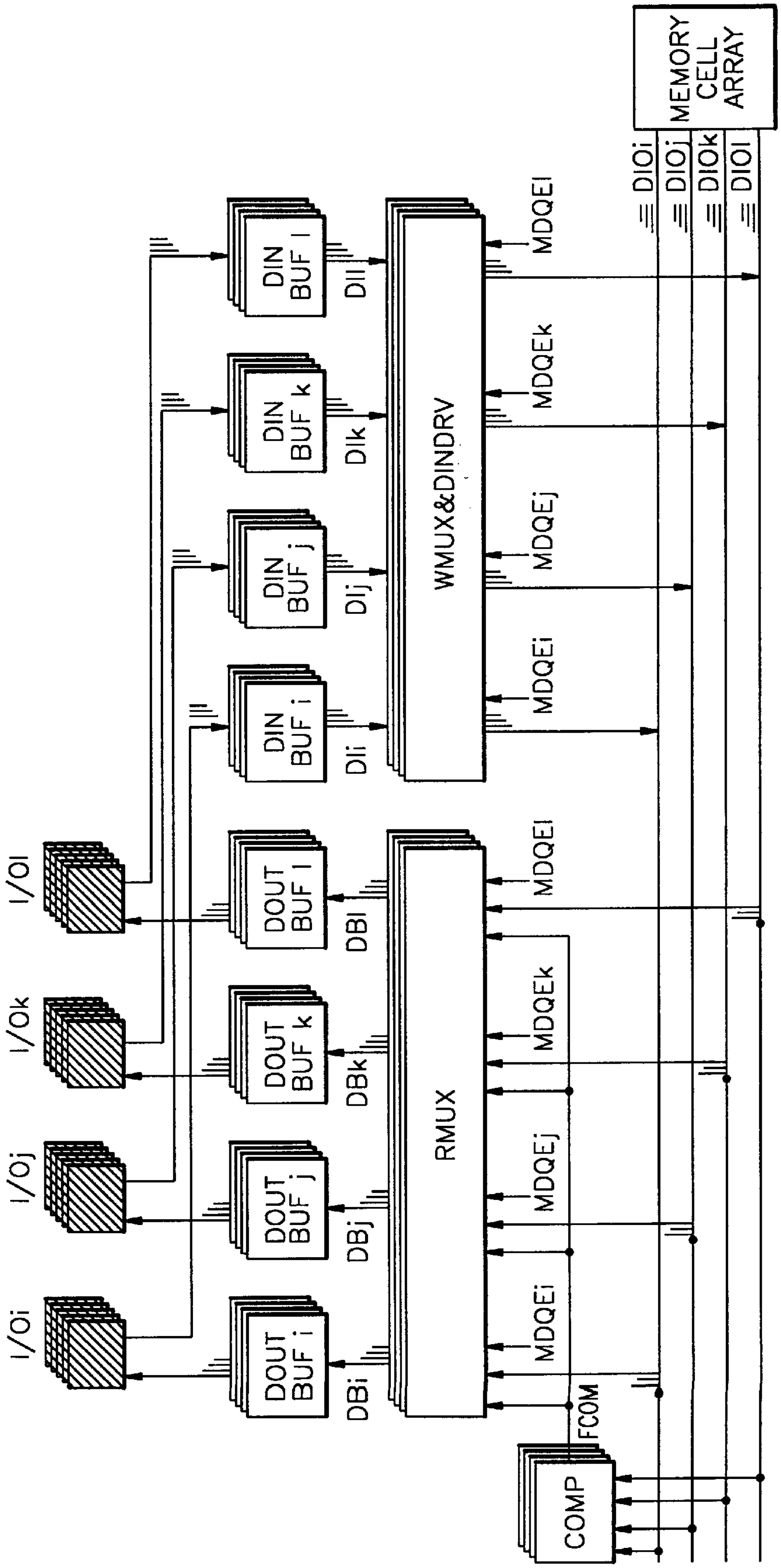
FIG. 4 is a block diagram of memory devices which are tested by selectively using one of a plurality of data input/output channel groups according to the present invention.

Referring to FIG. 4, a memory device which is tested by selecting one of a plurality of data input/output channels according to the present invention, includes four data input buffers DIN BUF i, DIN BUF j, DIN BUF k and DIN BUF l; a write multiplexer WMUX; a data input driver DINDRV; a read multiplexer RMUX; four data output buffers DOUT BUF i, DOUT BUF j, DOUT BUF k and DOUT BUF l; and a comparator COMP. It will be understood that groups of input/output channels, groups of data output buffers, groups of data input buffers, groups of data input drivers, groups of comparators, groups of data input drivers, groups of read multiplexers and groups of write multiplexers also may be provided, as shown in FIG. 4.

The data input buffer groups DIN BUF i, DIN BUF j, DIN BUF k and DIN BUF l buffer data input via four data input/output channel groups I/Oi, I/Oj, I/Ok and I/Ol. The write multiplexer group WMUX responds to four control signals MDQEi, MDQEj, MDQEk and MDQEl. One of the control signals MDQEi, MDQEj, MDQEk and MDQEl is enabled when one of the four data input/output channel groups I/Oi, I/Oj, I/Ok and I/Ol is selected in a test mode. The write multiplexer group WMUX receives the data loaded onto one of the data lines DIi, DIj, DIk and DIl, after being buffered in one of the data input buffer groups DIN BUF i, DIN BUF j, DIN BUF k and DIN BUF l, and then the data is loaded onto the four data input/output lines DIOi, DIOj, DIOk and DIOl via the data input driver group DINDRV to be stored in memory cells.

The read multiplexer group RMUX responds to four control signals MDQEi, MDQEj, MDQEk and MDQEl, and receives comparison data FCOM output from the comparator group COMP. The data output buffer groups DOUT BUF i, DOUT DBF j, DOUT BUF k and DOUT BUF l receive the data loaded onto the four data bus groups DBi, DBj, DBk and DBl after output from the read multiplexers RMUX, buffer the received data, and then output the buffered data to external of the memory device via the data input/output channel groups I/Oi, I/Oj, I/Ok and I/Ol. The comparator group COMP operates in a test mode and each comparator of the comparator group COMP outputs the comparison data FCOM by comparing the data loaded onto the four data input/output lines DIOi, DIOj, DIOk and DIOl.

Operation of a memory device in a normal mode will now be described. When data is input from external of the device via the data input/output channel groups I/Oi, I/Oj, I/Ok and I/Ol, the data is buffered by the data input buffers DIN BUF i, DIN BUF j, DIN BUF k and DIN BUF l and then input to the write multiplexer group WMUX via the data lines DIi, DIj, DIk and DIl. The data output from the write multiplexer group WMUX is input to the data input driver group DINDRV and then written to memory cells via the data input/output lines DIOi, DIOj, DIOk and DIOl.

Also, the data stored in the memory cells is input to the read multiplexer group RMUX via the data input/output lines DIOi, DIOj, DIOk and DIOl, and the data output from the read multiplexer group RMUX is input to the data output buffer groups DOUT BUF i, DOUT BUF j, DOUT BUF k and DOUT BUF l via the data buses DBi, DBj, DBk and DBl. The data buffered by the data output buffer groups DOUT BUF i, DOUT BUF j, DOUT BUF k and DOUT BUF l are output to external of the memory device via the data input/output channel groups I/Oi, I/Oj, I/Ok and I/Ol. The control signals MDQEi, MDQEj, MDQEk and MDQEl may be input to the read multiplexer group RMUX and the write multiplexer group WMUX via a pad from external of the memory device, or may be generated by a combination of signals that are input from external of the memory device.

Operation of a memory device in a test mode will be described. First, one of the control signals MDQEi, MDQEj, MDQEk and MDQEl, e.g., the ith control signal MDQEi, is activated, and the data is input via the ith data input/output channel group I/Oi. The input data is buffered by the ith data input buffer group DIN BUF i and then input to the write multiplexer group WMUX via the ith data line DIi. The data output from the write multiplexer group WMUX is input to the data input driver group DINDRV, and the data output from the data input driver group DINDRV is written to the memory cells via all of the data input/output lines DIOi, DIOj, DIOk and DIOl.

The data stored in the memory cells is input to the comparator group COMP via the data input/output lines DIOi, DIOj, DIOk and DIOl. The comparison data FCOM output from the comparator group COMP is output to external of the memory device via the read multiplexer group RMUX, the ith data output buffer group DOUT BUF l, and the ith data input/output channel I/Oi, in sequence. When the jth control signal MDQEj is activated, the data are input and output via the jth data input/output channel group I/Oj.

Thus, according to the present invention, the write multiplexer group WMUX and the read multiplexer group RMUX respond to the control signals MDQEi, MDQEj, MDQEk and MDQEl, and the data is input or output via all the four data input/output channel groups I/Oi, I/Oj, I/Ok and I/Ol in a normal mode. However, in a test mode, one of the control signals MDQEi, MDQEj, MDQEk and MDQEj is activated and the data is input or output via only the corresponding one of data input/output channel groups.

Figure 5:
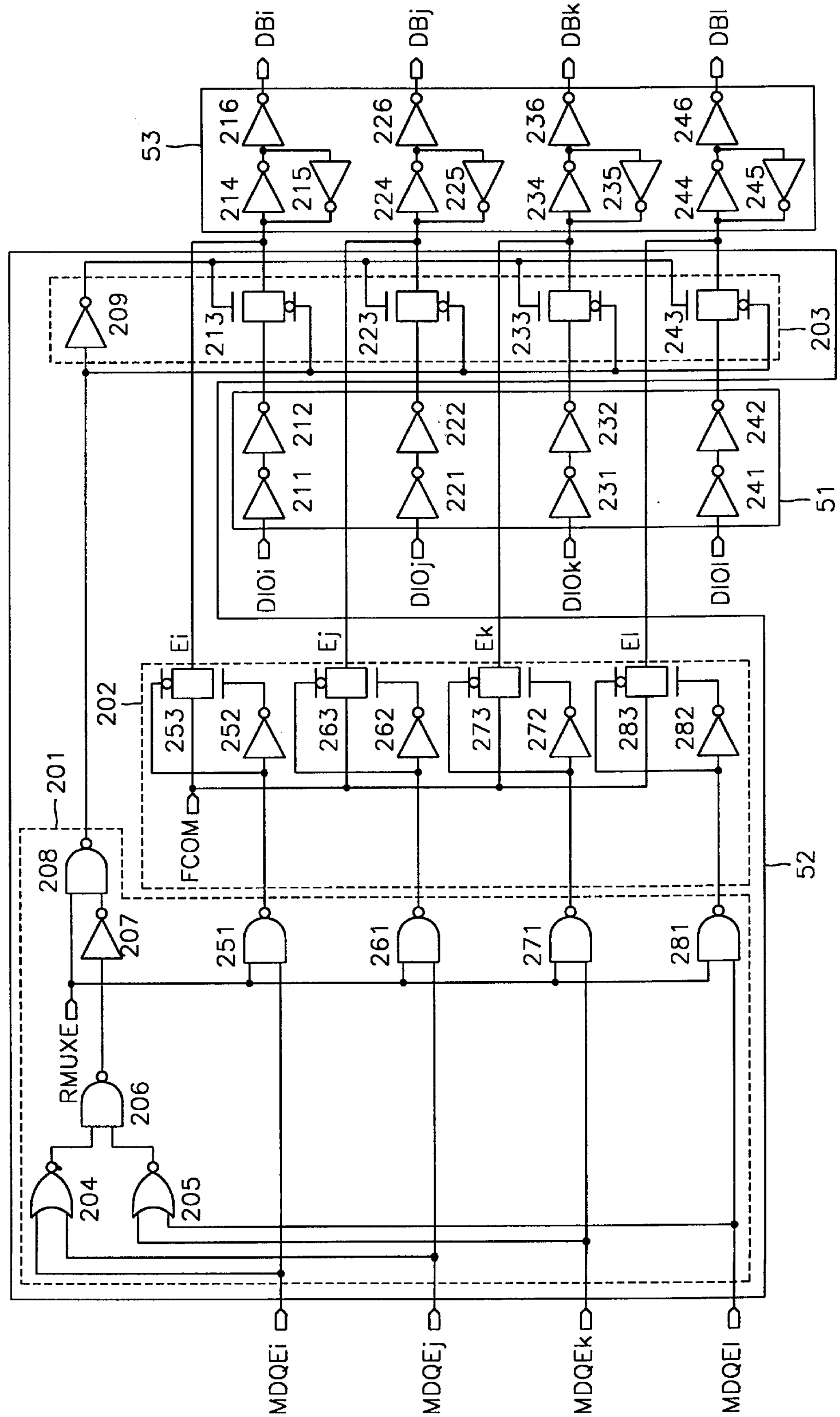
FIG. 5 is a circuit diagram of one of the read multiplexers RMUX shown in FIG. 4.

FIG. 5 is a circuit diagram of one of the read multiplexers RMUX shown in FIG. 4. Referring to FIG. 5, the read multiplexer RMUX includes a first buffering portion 51 for buffering the data loaded onto the data input/output lines DIOi, DIOj, DIOk and DIOl, a first select portion 52 and a first latch portion 53. The first select portion 51 selects the comparison data FCOM output from the comparator group COMP (see FIG. 4) or the data buffered by the first buffering portion 51. The first latch portion 53 latches the data selected by the first select portion 52 and then provides the latched result to the data buses DBi, DBj, DBk and DBl.

The first buffering portion 51 includes inverters 211 and 212, 221 and 222, 231 and 232, and 241 and 242, wherein each of the paired inverters is serially connected to the data input/output lines DIOi, DIOj, DIOk and DIOl, respectively. The first latch portion 53 includes inverters 214 through 216, 224 through 226, 234 through 236, and 244 through 246, wherein each of the inverter groups latches the data loaded onto the data input/output lines DIOi, DIOj, DIOk and DIOl, respectively.

The first select portion 52 includes a first controller 201, a first switch 202 and a second switch 203. The first controller 201 switches on one of the first switch 202 and the second switch 203 and includes a first NOR gate 204, a second NOR gate 205, a first NAND gate 206, an inverter 207, a second NAND gate 208 and third through sixth NAND gates 251, 261,271 and 281. The first NOR gate 204 receives two of the control signals MDQEi, MDQEj, MDQEk and MDQEl, e.g., the ith control signal MDQEi and the jth control signal MDQEj. The second NOR gate 205 receives the remaining two controls signals, e.g., the kth control signal MDQEk and the Ith control signal MDQEl. The first NAND gate 206 receives the signals output from the first and second NOR gates 204 and 205, and the inverter 207 inverts the signal output from the first NAND gate 206.

The second NAND gate 208 receives the signal output from the inverter 207 and a read multiplexer enable signal RMUXE which is activated to a logic high when the read multiplexer group RMUX is enabled. The third through sixth NAND gates 251, 261, 271 and 281 receive one of the control signals MDQEi, MDQEj, MDQEK and MDQEl and the read multiplexer enable signal RMUXE. In other words, the third NAND gate 251 receives the read multiplexer enable signal RMUXE and the ith control signal MDQEl, and the fourth NAND gate 261 receives the read multiplexer enable signal RMUXE and the jth control signal MDQEj.

The first switch 202 transmits the comparison data FCOM to the first latch 53 while being switched on in response to the signals output from the third through sixth NAND gates 251, 261, 271 and 281. The first switch 202 includes inverters 252, 262, 272 and 282 for inverting each signal output from the third through sixth NAND gates 251, 261, 271 and 281, and transmission gates 253, 263, 273 and 283 each having one end receiving each signal output from the third through sixth NAND gates 251, 261, 271 and 281, and the other end receiving each signal output from the inverters 252, 262, 272 and 282.

In other words, when one of the control signals MDQEi, MDQEj, MDQEk and MDQEl, e.g., the ith control signal MDQEi, is activated, only the transmission gate 253 connected to the ith control signal MDQEi is turned on. As a result, the comparison data FCOM is transmitted to the first latch 53 via only the transmission gate 253.

The second switch 203 transmits all the data output from the first buffering portion 51 to the first latch portion 53 while activated in response to the signal output from the second NAND gate 208. The second switch 203 includes an inverter 209 for inverting the signal output from the second NAND gate 208 and a plurality of transmission gates 213, 223, 233 and 243 each having one end receiving the signal output from the second NAND gate 208 and the other end receiving the signal output from the inverter 209. That is, the first switch 202 and the second switch 203 are switched on or off complementarily, such that the first switch 202 is switched on in the test mode and the second switch 203 is switched on in the normal mode.

Operation of the read multiplexer group RMUX in a normal mode will now be described. Since all the control signals MDQEi, MDQEj, MDQEk and MDQEl are disabled to a logic low, the output end of the second NAND gate 208 of the first controller 201 is a logic low, and the output ends of the third through sixth NAND gates 251, 261, 271 and 281 are a logic high, so that the first switch 202 is switched off and the second switch 203 is switched on. Thus, the data loaded onto the data input/output lines DIOi, DIOj, DIOk and DIOl is loaded onto the data buses DBi, DBj, DBk and DBl, respectively, via the first buffering portion 51 and the first latch portion 53 in sequence. The data loaded onto the data buses DBi, DBj, DBk and DBl are output to external of the semiconductor memory device via the data input/output channel groups I/Oi, I/Oj, I/Ok and I/Ol (see FIG. 4).

Operation of the read multiplexer group RMUX in a test mode will now be described. When one of control signals MDQEi, MDQEj, MDQEk and MDQEl, e.g., the ith control signal MDQEi, is activated to a logic high, the output end of the second NAND gate 208 of the first controller 201 is a logic high, so that the second switch 203 is turned off. Also, the output end of the third NAND gate 251 is a logic low, and the output ends of the fourth through sixth NAND gates 261, 271 and 281 are a logic high. As a result, only the transmission gate 253 connected to the ith control signal MDQEi is switched on. Thus the comparison data FCOM is loaded onto only the ith data bus DBi.

The data loaded onto the ith data bus DBi is output to external of the memory device via the ith data input/output channel group I/Oi (see FIG. 4). Also, when only the jth control signal MDQEj is activated to a logic high, the output end of the fourth NAND gate 261 is a logic low, and the output ends of the third, fifth and sixth NAND gates 251, 271 and 281 are a logic high. Thus, the comparison data FCOM is loaded onto only the jth data bus DBj, and then output via the jth data input/output channel IIOj. Thus, when one of the plurality of control signals MDQEi, MDQEj, MDQEk and MDQEl is activated in a test mode, the memory device outputs the data only to one of the data input/output channel groups I/Oi, I/Oj, I/Ok and I/Ol, corresponding to the activated control signal.

Figure 6:
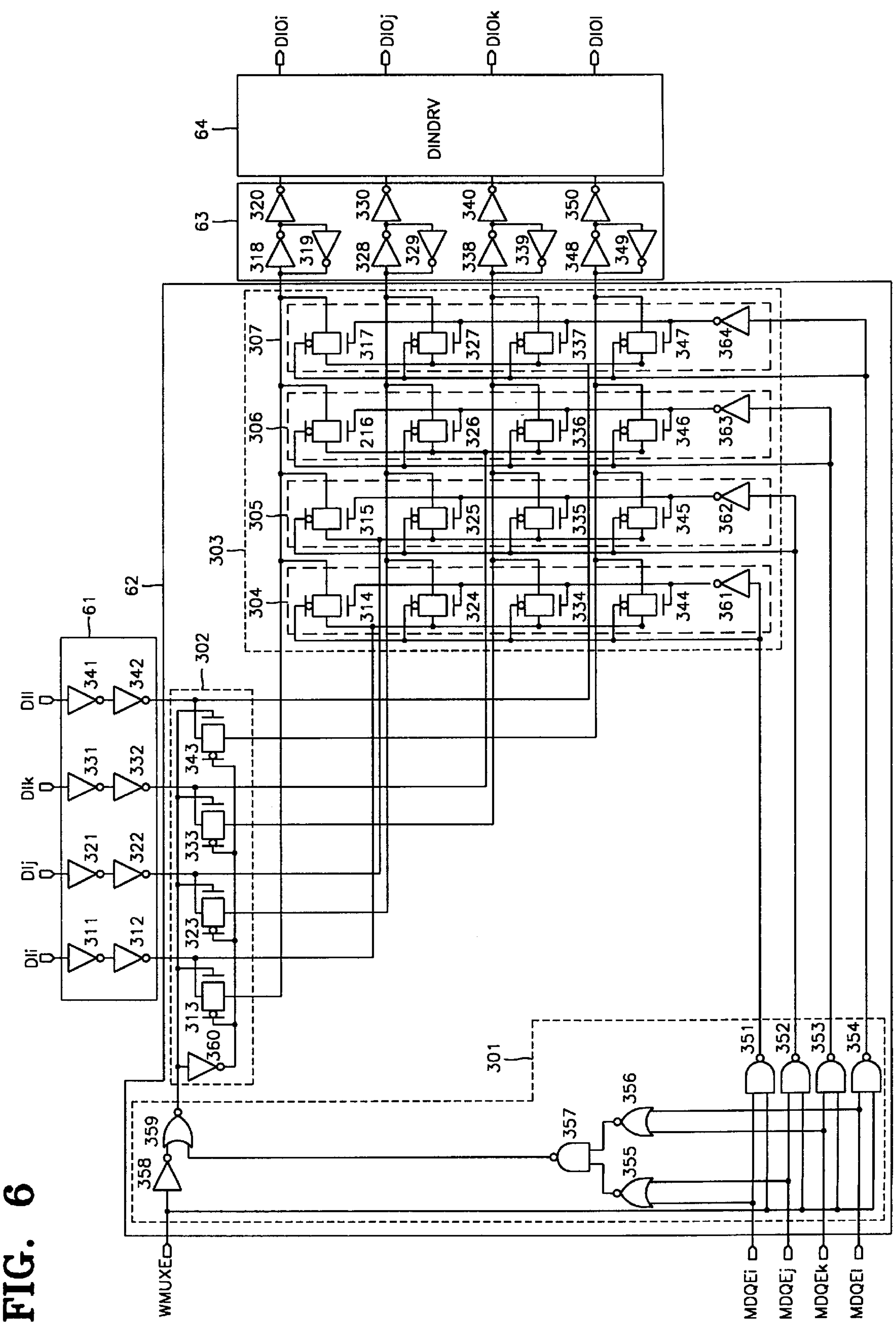
FIG. 6 is a circuit diagram of one of the write multiplexers WMUX shown in FIG. 4.

FIG. 6 is a circuit diagram of one write multiplexer of the write multiplexer groups WMUX shown in FIG. 4. Referring to FIG. 6, the write multiplexer WMUX includes a second buffering portion 61 for buffering the data loaded onto the data lines DIi, DIj, DIk and DIl, respectively, a second select portion 62 and a second latch portion 63. The second select portion 62 selects the data buffered after input via one of the data lines DIi, DIj, DIk and DIl or the data buffered after input via all the data lines DIi, DIj, DIk and DIl. The second latch portion 63 latches the data selected by the second select portion 62.

The second buffering portion 61 includes inverters 311 and 312, 321 and 322, 331 and 332, and 341 and 342, wherein each paired inverter is connected to the data lines DIi, DIj, DIk and DIl in series. The second latch portion 63 includes inverters 318 through 320, 328 through 330, 338 through 340 and 348 through 350, wherein each inverter group latches the data output from the second select portion 62.

The second select portion 62 includes a second controller 301, a third switch 302 and a fourth switch 303. The second controller 301 activates the third switch 302 or the fourth switch 303 by receiving the write multiplexer enable signal WMUXE, which is active to a logic high when the write multiplexer group WMUX is enabled, and the control signals MDQEi, MDQEJ, MDQEk and MDQEl. The second controller 301 includes eleventh through fourteenth NAND gates 351, 352, 353 and 354, an eleventh NOR gate 355, a twelfth NOR gate 356, a fifteenth NAND gate 357, an inverter 358 and a thirteenth NOR gate 359.

The eleventh through fourteenth NAND gates 351, 352, 353 and 354 receive one of the control signals MDQEi, MDQEj, MDQEk and MDQEl, and the eleventh NOR gate 355 receives two of the control signals MDQEi, MDQEj, MDQEk and MDQEl, e.g., the ith control signal MDQEi and the jth control signal MDQEj, and the twelfth NOR GATE 356 receives the remaining two control signals, e.g., the kth control signal MDQEk and the Ith control signal MDQEl. The fifteenth NAND gate 357 receives the signal output from the eleventh and twelfth NOR gates 355 and 356, the inverter 358 inverts the write multiplexer enable signal WMUXE, and the thirteenth NOR gate 359 receives the signal output from the inverter 358 and the signal output from the fifteenth NAND gate 357. In other words, the thirteenth NOR gate 359 outputs a signal for activating the third switch 302, and the eleventh through fourteenth NAND gate 351, 352, 353 and 354 output a signal for activating the fourth switch 303.

The third switch 302 transmits the data input via all the data lines DIi, DIj, DIk and DIl and buffered by the second buffering portion 61 to the second latch portion 63. The third switch 302 includes an inverter 360 for inverting the signal output from the thirteenth NOR gate 359, and a plurality of transmission gates 313, 323, 333 and 343. The inverter 360 inverts the signal output from the thirteenth NOR gate 359, and the plurality of transmission gates 313, 323, 333 and 343 each have one end for receiving the signal output from the thirteenth NOR gate 359, and the other end for receiving the signal output from the inverter 360.

The fourth switch 303 transmits the data input via one of the data lines DIi, DIj, DIk and DIl after being buffered by the second buffering portion 61 to the second latch portion 63. The fourth switch 303 includes first through fourth transmission portions 304, 305, 306 and 307. The first through fourth transmission portions 304, 305, 306 and 307 include inverters 361, 362, 363 and 364 for inverting the signals output from the eleventh through fourteenth NAND gates 351, 352, 353 and 354, respectively, and a plurality of transmission gates 314 through 317, 324 through 327, 334 through 337 and 344 through 347, each group having one end for receiving one of the signals output from the eleventh through fourteenth NAND gates 351, 352, 353 and 354, and the other end for receiving one of the signals output from the inverters 361, 362, 363 and 364.

That is, when the first transmission portion 304 is switched on in response to the signal output from the eleventh NAND gate 351, the data loaded onto the ith data line DIi go through the first transmission portion 304, the second latch portion 63 and a data input driver DINDRV 64 in sequence, and then are loaded onto the data inpuvoutput lines DIOi, DIOj, DIOk and DIOl to be stored in memory cells. The data input driver DINDRV 64 prevents a DC current from occurring during the data read operation, which is caused when the data output from the second latch portion 63 is directly loaded onto the data input/output lines DIOi, DIOj, DIOk and DIOl. In other words, the third switch 302 and the fourth switch 303 are complementarily switched on or off according to the normal mode or the test mode.

Operation of the write multiplexer WMUX in a normal mode will be described. The control signals MDQEi, MDQEj, MDQEk and MDQEl are disabled to a logic low, so that the output ends of the eleventh through fourteenth NAND gates 351, 352, 353 and 354, and the output end of the thirteenth NOR gate 359 is a logic high. Thus, the third switch 302 is activated, and the fourth switch 303 is deactivated, and the data loaded onto the data lines DIi, DIj, DIk and DIl are then loaded onto the data input/output lines DIOi, DIOj, DIOk and DIOl to be stored in the memory cells. Then, because one of the control signals MDQEi, MDQEj, MDQEk and MDQEl is active at a logic high in a test mode, the output end of the thirteenth NOR gate 359 is a logic low, thereby switching off the third switch 302.

When the ith control signal MDQEi of the control signals MDQEi, MDQEj, MDQEk and MDQEl is active at a logic high, the output end of the eleventh NAND gate 351 is a logic low, thereby switching on only the first transmission portion 304 of the fourth switch 303. Thus, the data loaded onto the ith data line DIi is loaded onto the data input/output lines DIOi, DIOj, DIOk and DIOl via the first transmission portion 304.

Also, when the jth control signal MDQEj among the control signals is activated at a logic high, the output end of the twelfth NAND gate 352 is a logic low, thereby switching on only the second transmission portion 305 of the fourth switch 303. Thus, the data loaded onto the jth data line DIj is loaded onto the data input/output lines DIOi, DIOj, DIOk and DIOl via the second transmission portion 305.

One of the write multiplexers WMUX is enabled by activating one of the plurality of control signals MDQEi, MDQEj, MDQEk and MDQEj in a test mode. Thus, the data is input only to one of the data input/output channel groups I/Oi, I/Oj, I/Ok and I/Ol, which corresponds to the activated control signal. It will be understood that the above testing systems and methods can be applied to a reduced data (RDQ) as well as a merged data (MDQ) memory device.

As described above, according to the present invention, one of the data input/output channel groups can be selected to test a circuit of the memory device, related to the selected data input/output channel group. By selecting in sequence all the data input/output channel groups, all circuits of the memory device related to the data input/output channel groups, can be tested.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. An integrated circuit memory device comprising:

a plurality of input/output channels;

an array of memory cells;

a plurality of data input buffers, a respective one of which is responsive to a respective one of the plurality of input/output channels to buffer input data from the plurality of input/output channels;

a write multiplexer that is connected between the plurality of input data buffers and the array of memory cells to transmit the buffered input data for writing in the array of memory cells in response to a plurality of control signals in a normal mode, the write multiplexer being responsive to a selected one of the plurality of the control signals in a test mode to transmit the buffered input data from one of the plurality of input data buffers that corresponds to the selected one of the plurality of control signals to the memory cell array;

a plurality of data output buffers, a respective one of which buffers memory cell data that is read from the array of memory cells to the plurality of input/output channels;

a read multiplexer that is responsive to the array of memory cells to transmit the memory cell data that is read from the array of memory cells to the plurality of data output buffers in response to the plurality of control signals in the normal mode, the read multiplexer being responsive to the selected one of the plurality of control signals in the test mode to transmit the memory cell data to one of the plurality of output data buffers that corresponds to the selected one of the plurality of control signals; and a comparator that receives the memory cell data that is read from the array of memory cells in the test mode and that provides comparison data to the read multiplexer.

2. An integrated circuit memory device according to claim 1, wherein the control signals are received from external of the memory device.

3. An integrated circuit memory device according to claim 1, wherein the read multiplexer comprises:

a first buffering portion that receives the memory cell data and buffers the memory cell data;

a first selection portion that selects the comparison data or the memory cell data from the first buffering portion; and a first latch portion that latches the output of the first selection portion.

4. An integrated circuit memory device according to claim 3, wherein the first selection portion comprises:

a first switching portion including a plurality of first switches that transmit the comparison data when one of the first switches is activated;

a second switching portion including a plurality of second switches that transmit the output of the first buffering portion when the second switches are activated; and a first controller that outputs a signal to activate one of the first switches, or a signal to activate the second switches, in response to a read multiplexer enable signal that enables the read multiplexer and the control signals.

5. An integrated circuit memory device according to claim 4, wherein the second switches are activated in the normal mode.

6. An integrated circuit memory device according to claim 4, wherein the one of the first switches is activated in the test mode.

7. An integrated circuit memory device according to claim 4, wherein the first switches and the second switches are activated or deactivated complementarily, such that the first switches are activated in the test mode and the second switches are activated in the normal mode.

8. An integrated circuit memory device according to claim 4, wherein the output of the first buffering portion is output via the plurality of data input/output channels when the second switches are activated.

9. An integrated circuit memory device according to claim 4, wherein the comparison data is output via the selected one of the data input/output channels when one of the first switches is activated.

10. An integrated circuit memory device according to claim 1, wherein the write multiplexer comprises:

a second buffering portion that buffers the buffered input data;

a second selection portion that selects the buffered input data from all the plurality of data input/output channels, or selects the buffered input data from the selected one of the data input/output channels; and a second latch portion that latches the output of the second selection portion.

11. An integrated circuit memory device according to claim 10, wherein the second selection portion comprises:

a third switching portion including a plurality of third switches that transmit the buffered input data from all the plurality of data input/output channel groups when the third switches are activated;

a fourth switching portion including a plurality of fourth switches that transmit the buffered input data from the selected one of the data input/output channels when one of the fourth switches is activated; and a second controller that outputs a signal to activate one of the fourth switches, or a signal to activate the third switches, in response to a write multiplexer enable signal that enables the write multiplexer and the control signals.

12. An integrated circuit memory device according to claim 11, wherein the third switches are activated in the normal mode.

13. An integrated circuit memory device according to claim 11, wherein one of the fourth switches is activated in the test mode.

14. An integrated circuit memory device according to claim 11, wherein the buffered input data from all the plurality of data input/output channels is stored in the memory cell array when the third switches are activated.

15. An integrated circuit memory device according to claim 11, wherein only the buffered data from one of the data input/output channels is stored in the memory cell array when one of the fourth switches is activated.

16. An integrated circuit memory device according to claim 11, wherein the third switches and the fourth switches are activated and deactivated complementarily, such that the third switches are activated in the normal mode and the fourth switches are activated in the test mode.

17. A method of testing an integrated circuit memory device including a memory cell array and a plurality of data input/output channels, comprising the steps of:

providing a plurality of control signals, a respective one of which corresponds to a respective one of the plurality of input/output channels; and activating a selected one of the plurality of control signals to thereby activate a selected one of the plurality of input/output channels during a test mode, wherein the activating step is repeatedly performed until all of the plurality of control signals are sequentially activated.

18. A method according to claim 17 further comprising the step of:

activating all of the plurality of control signals to thereby activate all of the plurality of input/output channels during a normal mode.

19. An integrated circuit memory device comprising:

a memory cell array;

a plurality of data input/output channels;

a plurality of control signal inputs, a respective one of which corresponds to a respective one of the plurality of input/output channels; and means for sequentially activating a selected one of the plurality of input/output channels in response to activation of a selected one of the plurality of control signal inputs during a test mode, until all the plurality of control signals are sequentially activated.

20. A memory device according to claim 19 further comprising:

means for activating all of the plurality of input/output channels in response to activation of all of the plurality of control signal inputs during a normal mode.

* * * * *